(12) United States Patent
Jang et al.

(10) Patent No.: US 6,812,072 B2
(45) Date of Patent: Nov. 2, 2004

(54) METHOD FOR CRYSTALLIZING AMORPHOUS FILM AND METHOD FOR FABRICATING LCD BY USING THE SAME

(75) Inventors: Jin Jang, Hyundai APT. 102-1103, 53, Jamwon-dong, Seocho-gu, Seoul (KR); Kyung Ho Kim, Tongdaemun-gu (KR); Ah Young Kim, Tongdaemun-gu (KR)

(73) Assignees: LG. Philips LCD Co., Ltd., Seoul (KR); Jin Jang, Seoul (KR)

( * ) Notice: Subject to any disclaimer, the term of this patent is extended or adjusted under 35 U.S.C. 154(b) by 0 days.

(21) Appl. No.: 10/189,510

(22) Filed: Jul. 8, 2002

(65) Prior Publication Data

US 2003/0013279 A1 Jan. 16, 2003

(30) Foreign Application Priority Data

Jul. 10, 2001 (KR) ........................................ 2001-41378

(51) Int. Cl.[7] .............................................. H01L 21/00
(52) U.S. Cl. ...................... 438/149; 438/466; 438/486
(58) Field of Search ................................ 438/155, 149, 438/466, 486

(56) References Cited

U.S. PATENT DOCUMENTS 6,326,226 B1 * 12/2001 Jang et al. .................. 438/486
6,500,736 B2 * 12/2002 Kim et al. ................... 438/486
6,558,986 B1 * 5/2003 Choi ........................... 438/149

OTHER PUBLICATIONS

Seok–Woon Lee et al., "Low Temperature Poly–Si Thin–Film Transistor Fabrication by Metal–Induced Lateral Crystallization"IEEE Electron Device Letters, vol. 17, No. 4, Apr. 1996, pp. 160–163.*

Khakifirooz et al., "Structural Improvement fo Amorphous Silicon using Metal–Induced Crystallization", IEEE 12th International Conference on Microelectronics, Tehran, Iran, Oct. 31–Nov. 2, 2000, pp. 237–240.*

* cited by examiner

Primary Examiner—W. David Coleman
(74) Attorney, Agent, or Firm—McKenna Long & Aldridge LLP

(57) ABSTRACT

A method for crystallizing an amorphous film for enhancing a crystallinity and minimizing an amount of remaining metal in a polycrystalline silicon thin film, and a method for fabricating a liquid crystal display device (LCD) by using the same. The method for crystallizing an amorphous film including forming an amorphous film on a substrate; forming a thin first metal layer; forming a second metal layer on the amorphous film at predetermined parts; and heat treating the amorphous film, for crystallizing the amorphous film.

47 Claims, 10 Drawing Sheets

(a)

(d)

(b)

(e)

(c)

METHOD FOR CRYSTALLIZING AMORPHOUS FILM AND METHOD FOR FABRICATING LCD BY USING THE SAME

This application claims the benefit of Korean Application No. P2001-41378 filed on Jul. 10, 2001, which is hereby incorporated by reference for all purposes as if fully set forth herein.

BACKGROUND OF THE INVENTION

1. Field of the Invention

The present invention relates to a method for crystallizing an amorphous film, and more particularly, to a method for crystallizing an amorphous film for enhancing a crystallinity, and a method for fabricating a liquid crystal display device (LCD) by using the same.

2. Background of the Related Art

As devices become larger, and more integrated, switching devices become thinner, and as a consequence the present amorphous silicon thin film transistors are replaced with polycrystalline thin film transistors.

With a process temperature below 350° C., though the amorphous silicon thin film transistor can be fabricated on a glass substrate with ease, it is difficult to employ the amorphous silicon thin film transistor in a fast operation circuit due to low mobility.

However, as the polycrystalline silicon has a higher mobility than amorphous silicon, a driving circuit can be fabricated on a glass substrate. Therefore, the polycrystalline silicon is favored as a switching device of a high resolution, large sized device.

The polycrystalline silicon may be formed by direct deposition of the polycrystalline silicon, or crystallizing amorphous silicon after the amorphous silicon is deposited. The latter method includes Solid Phase Crystallization (SPC), Excimer Laser Annealing (ELA), Metal Induced Crystallization (MIC), and the like.

A high crystallization temperature and a long heat treatment time period are characteristics of the SPC method. SPC is comparatively simple since it only requires a long time period of heat treatment in a furnace where temperature is more than 600° C. for forming the polycrystalline film. SPC has disadvantages in that fabrication of a device by SPC is difficult because SPC causes many defects inside the crystallized grains, and the glass substrate cannot be used due to the high crystallizing temperature.

ELA, in which an excimer laser with a short wave length and a high energy is irradiated momentarily for crystallizing a thin film, facilitates a low temperature crystallization at a temperature below 400° C., and produces a large sized grain with excellent properties. However, since ELA progresses non-uniform crystallization and requires expensive equipment, ELA is not suitable for mass production and fabrication of large sized devices.

MIC, introduced through research for decreasing the crystallization temperature, facilitates crystallization at a temperature below 500° C., and is favored for fabrication of a large sized LCD.

Field Enhanced-Metal Induced Crystallization (FE-MIC) is a developed form of MIC for crystallizing at a low temperature by using catalytic metal in an electric field. In the development of FE-MIC, the crystallization temperature of a thin film decreases significantly when a metal impurity is added to an amorphous silicon film because free electrons of the metal decreases a bonding energy of the silicon due to an action of the free electrons of the metal.

FE-MIC is favored in large sized glass substrate applications because crystallization time is shortened and the crystallization temperature decreases significantly compared to present MIC when an electric field is applied to the amorphous silicon film having a catalytic metal contained therein. In general, FE-MIC is influenced by an amount of the catalytic metal; the more the catalytic metal, the lower the crystallization temperature.

The steps of a related art method for crystallizing an amorphous film, and the steps of a related art method for fabricating an LCD by using the same will be explained, with reference to the attached drawings.

FIGS. 1A–1C illustrate the steps of a related art method for crystallizing an amorphous silicon film. First, the steps of a related art method for crystallizing an amorphous film will be explained.

Referring to FIG. 1A, a buffer layer 2 is formed on a substrate 1, and amorphous silicon is deposited thereon at 300–400° C. by Plasma Enhanced CVD (PECVD), Low-Pressure CVD (LPCVD) using silane gas or by sputtering to form an amorphous silicon thin film 3. The buffer layer 2 prevents impurities in the substrate 1 from diffusing into the amorphous silicon thin film 3, and cuts off a thermal flow to the substrate 1 in a later crystallization.

Next, referring to FIG. 1B, a metal, such as nickel, is deposited on the amorphous thin film 3 by using plasma of non-reactive gas to form a catalytic metal layer 4.

Then, referring to FIG. 1C, electrodes 5 are provided at opposite ends of the catalytic metal layer 4, and an electric field is applied thereto, to activate free electrons of the catalytic metal layer 4. Then, the bonding energy of silicon is decreased by the free electron of the nickel atoms, to decrease the crystallization temperature, and the nickel atoms are diffused into the silicon thin film to form nickel silicide. The nickel atom acts as a seed of the crystallization.

In the crystallization of the amorphous silicon by using the nickel silicide, a needle-like form of crystalline grain phase grows in the <111>orientation direction because of the nickel silicide.

Thus, the amorphous silicon thin film 3 on the substrate 1 is crystallized into a polycrystalline silicon thin film. FE-MIC shortens crystallization time, and decreases the crystallization temperature compared to existing MIC, when the electric field is applied to the amorphous silicon thin film. FE-MIC provides a fast crystallization rate, low cost, and provides the possibility for large sized glass substrate applications.

Devices with high mobility can be fabricated if the foregoing method for crystallizing an amorphous film is applied to a semiconductor device, an LCD, or the like.

The step of the related art method for fabricating an LCD by using the FE-MIC will be explained.

First, a buffer layer is formed of a silicon oxide on a thin film array substrate, and an amorphous silicon thin film is formed thereon. An electric field is applied to the amorphous silicon thin film while heating the amorphous silicon thin film, to crystallize the amorphous silicon thin film into a polycrystalline silicon thin film.

Next, the polycrystalline silicon thin film is patterned, to form an active semiconductor layer, and silicon nitride SiNx is deposited on an entire surface including the semiconductor layer, to form a gate insulating film.

Then, a low resistance metal film is deposited on the gate insulating film, patterned by photolithography, to form a gateline and a gate electrode, and impurities are injected into the semiconductor layer with the gate patterns used as mask, to form source/drain regions.

Next, source/drain electrodes are formed for connecting the dataline perpendicular to the gateline to the source/drain regions. The data patterns are insulated form the gate patterns by an interlayer insulating film.

Then, a protection film is formed on an entire surface including the source/drain electrodes, and a pixel electrode is formed connected to the drain electrode through the protection film, thereby completing fabrication of an array substrate of an LCD.

When a color filter substrate with a color filter layer and a common electrode is bonded to the thin film array substrate, and a liquid crystal layer is formed between the two substrates, the LCD is formed.

However, the related art method for crystallizing an amorphous film, and a method for fabricating an LCD by using the same have the following problems.

That is, FE-MIC shows a trend that the greater the amount of the catalytic metal, the lower the crystallization temperature. However, the increased amount of the catalytic metal impedes an adequate growth of the crystalline grain, and causes a current leakage due to remaining catalytic metal. For applications to a large sized device, it is very important that the amount of metal, employed in the crystallization and remaining in the crystallized silicon thin film, is minimized.

In order to resolve this problem, though Metal Induced Lateral Crystallization (MILC) is employed, MILC has a disadvantage of an increased crystallization time period, with a crystallization rate of ~2 $\mu$m/h at 500° C.

SUMMARY OF THE INVENTION

Accordingly, the present invention is directed to a method for crystallizing an amorphous film, and a method for fabricating an LCD by using the same that substantially obviates one or more of the problems due to limitations and disadvantages of the related art.

An advantage of the present invention is to provide a method for crystallizing an amorphous film, for enhancing a crystallinity of the crystallized thin film and shortening a crystallization time period, and a method for fabricating an LCD by using the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for crystallizing an amorphous film includes forming an amorphous film on a substrate; forming a thin first metal layer; forming a second metal layer on the amorphous film at predetermined parts; and heat treating the amorphous film, for crystallizing the amorphous film.

In another aspect of the present invention, there is provided a method for fabricating a liquid crystal display device, including forming an amorphous film on a first substrate; forming a thin first metal layer; forming a second metal layer on the amorphous film at predetermined parts; heat treating the amorphous film, for crystallizing the amorphous film to form polycrystalline film; patterning the polycrystalline film, to form a semiconductor layer; forming a gate electrode in a part of the semiconductor layer insulated from the semiconductor layer; forming a channel region and source/drain regions by injecting impurities into the semiconductor layer; forming source/drain electrodes connected to the source/drain regions respectively; forming a pixel electrode connected to the drain electrode; and forming a liquid crystal layer between the first substrate and a second substrate opposite to the first substrate.

That is, the present invention provides a crystallizing method by forming a second metal layer having a plurality of patterns independent from a first thin metal layer, and subjecting the second metal layer to heat treatment and an electric field, whereby an amount of remaining metal is reduced as much as possible and the crystallinity of a crystallized thin film is enhanced.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings.

First Embodiment

FIGS. 2A–2D illustrate the steps of a method for crystallizing an amorphous silicon film in accordance with a first embodiment of the present invention.

Figure 3:
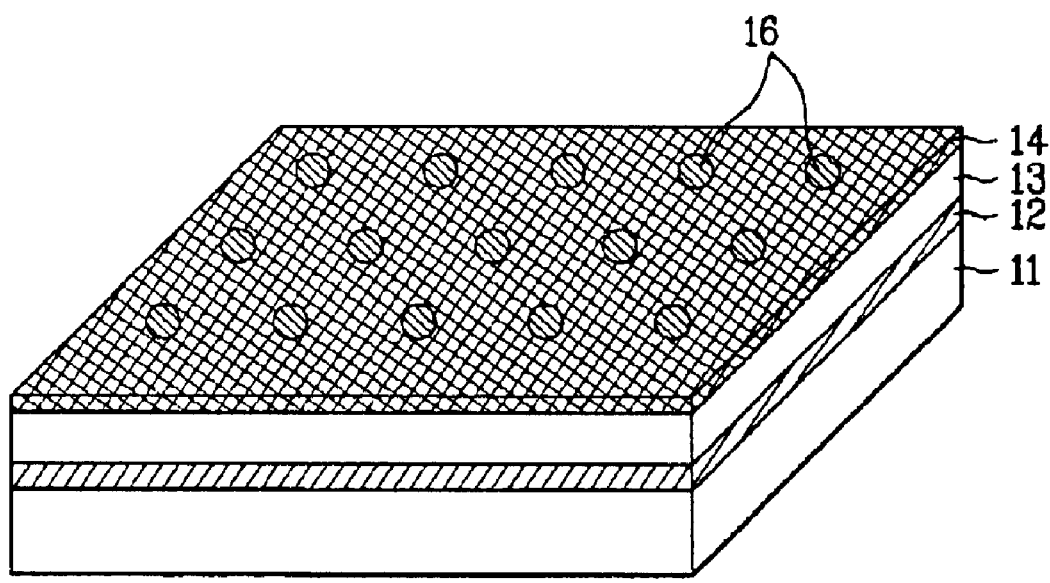
FIG. 3 illustrates a perspective view for explaining a method for crystallizing an amorphous silicon film in accordance with a first embodiment of the present invention.

FIG. 3 illustrates a perspective view for explaining a method for crystallizing an amorphous silicon film in accordance with a first embodiment of the present invention.

Figure 1A:
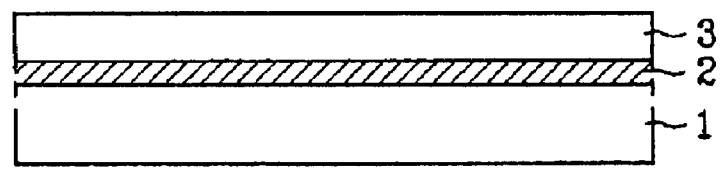
FIGS. 1A–1C illustrate the steps of a related art method for crystallizing an amorphous silicon film.
Figure 1B:
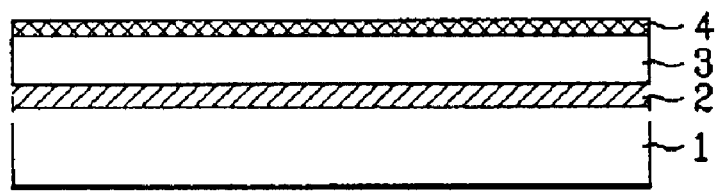
Figure 1C:
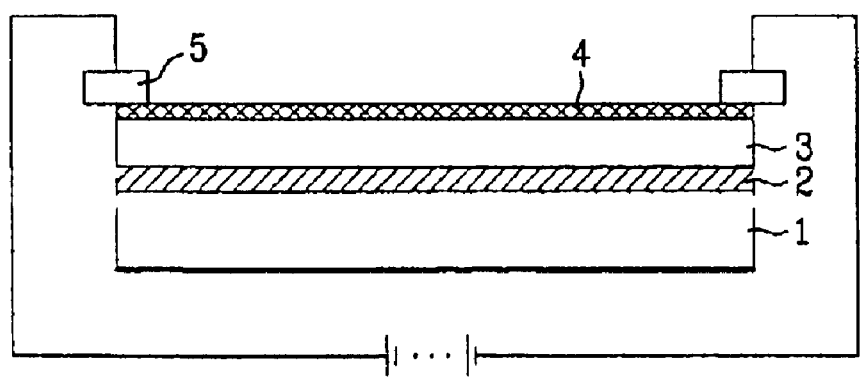
Figure 2A:
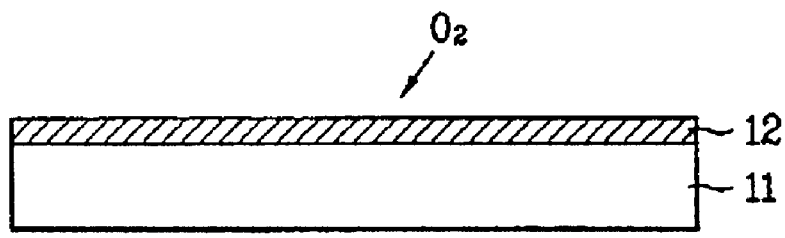
FIGS. 2A–2D illustrate the steps of a method for crystallizing an amorphous silicon film in accordance with a first embodiment of the present invention.

Referring to FIG. 2A, a silicon film is formed on a substrate 11, and made to react with oxygen $O_2$ or water vapor at a high temperature ranging 800–1200° C., to form a silicon oxide ($SiO_2$) film 12.

The silicon oxide film 12 prevents impurities in the substrate 11 from diffusing into the amorphous silicon thin film 13, and cuts off a thermal flow into the substrate 11 in a later crystallization.

Figure 2B:
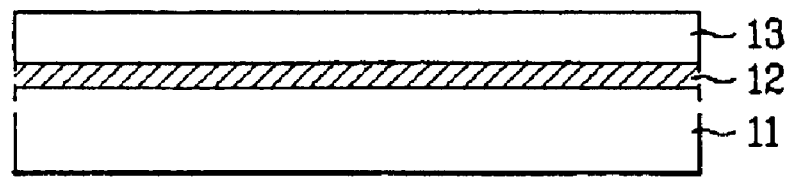

Referring to FIG. 2B, amorphous silicon is deposited on the silicon oxide film 12 at 300–400° C. by Plasma Enhanced Chemical Vapor Deposition (PECVD), Low-Pressure CVD (LPCVD) using silane gas, or by sputtering, to form an amorphous silicon thin film 13, and the amorphous silicon thin film 13 is crystallized by using a catalytic metal, and an electric field.

Figure 2C:
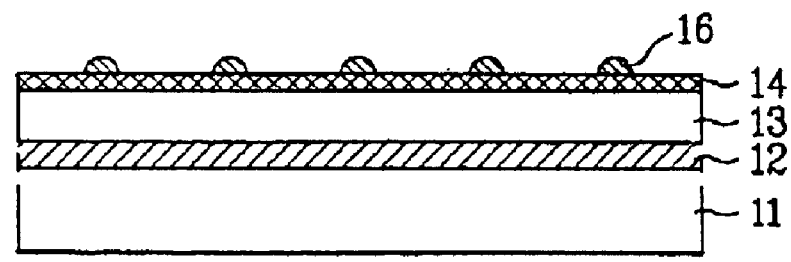

In detail, referring to FIG. 2C, a very thin and uniform film of a first catalytic metal 14 of nickel (Ni) or cobalt (Co) is deposited on an entire surface of the amorphous silicon thin film 13, and a uniform film of a second catalytic metal 16 of nickel (Ni) or cobalt (Co) is deposited on a part of the amorphous silicon thin film 13 having the first catalytic metal 14 disposed thereon.

In this instance, the second catalytic metal 16 forms a plurality of independent islands, which may be formed by covering the amorphous silicon thin film 13 with a mask having a plurality of independent patterns formed thereon and depositing the second catalytic metal, or by depositing the second catalytic metal on the amorphous silicon thin film, and removing the second catalytic metal from unnecessary parts by selective etching.

Thus, the thin deposition of the first catalytic metal and the deposition of the second catalytic metal in island forms on predetermined parts of the first catalytic metal thin film cause crystallization centered on the second catalytic metal, thereby enhancing the crystallinity.

In the meantime, the first and second catalytic metals 14 and 16 are deposited by using plasma of a non-reactive gas or may be deposited by using an ion beam or a metal solution. The foregoing methods are suitable for a small amount of deposition of the catalytic metal.

For example, sputtering will be explained. When a non-reactive gas transformed into a plasma state is accelerated and impacts nickel atoms aligned on a target, the nickel atoms are separated and disposed on the amorphous film.

In this instance, an incidental amount of the first catalytic metal is formed to about $5 \times 10^{12}$–$5 \times 10^{14}$ particles/cm², and an incidental amount of the second catalytic metal is formed to about $10^{14}$–$10^{16}$ particles/cm². An area of the second catalytic metal 16 is made to be less than about ½ of an area of the first catalytic metal 14.

It is very important to control an amount of the catalytic metal. Even though the crystallization temperature decreases if the amount of the catalytic metal is great, growth of the crystalline grain is not adequate, and a leakage current can occur by remaining catalytic metal.

Figure 2D:
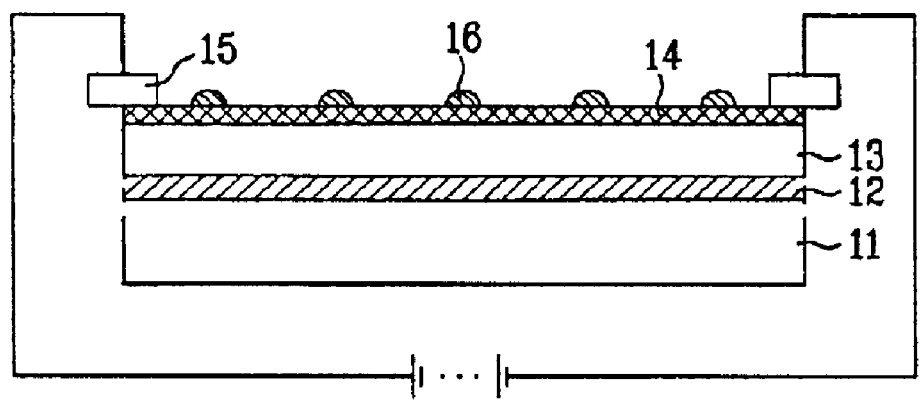

Referring to FIG. 2D, electrodes 15 are provided on opposite ends of the amorphous silicon thin film 13 having the first and second catalytic metals 14 and 16 disposed thereon, and a voltage is applied thereto. The electrodes are formed of molybdenum (Mo), graphite, or the like, and an intensity of an electric field is around 0–500V/cm, and is varied with time.

A first annealing for the amorphous silicon thin film 13 after deposition of the first catalytic metal 14, and a second annealing for the amorphous silicon thin film 13 after deposition of the second catalytic metal 16, are carried out, to elevate a temperature of the amorphous silicon thin film 13.

When the amorphous silicon thin film is heated to a predetermined temperature, the first and second catalytic metals are diffused to the silicon thin film from an interface with the silicon thin film, to form a silicide phase ($NiSi_2$), which accelerates crystallization and decreases the crystallization temperature.

The first and second annealing may be carried out simultaneously with the application of the electric field. Once the electric field is applied to the amorphous silicon thin film 13, free electrons of the first and second catalytic metals act to decrease a bonding energy of the silicon, to decrease the crystallization temperature of the thin film, significantly.

Eventually, there is growth of crystalline grains with the second catalytic metal taken as main seeds caused by the first and second catalytic metals, the electric field, and the annealing, to crystallize the amorphous silicon thin film into a polycrystalline silicon thin film.

Second Embodiment

Figure 4A:
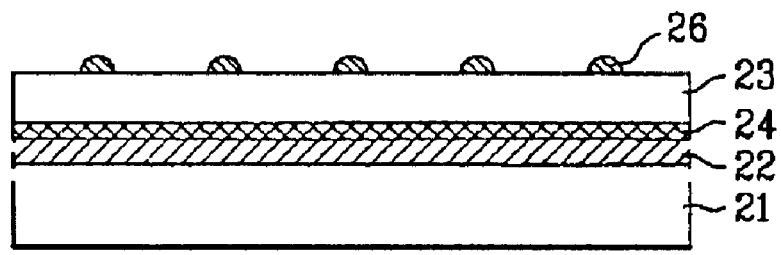
FIGS. 4A and 4B respectively illustrate a sectional and a perspective view for explaining a method for crystallizing an amorphous silicon film in accordance with a second embodiment of the present invention.
Figure 4B:
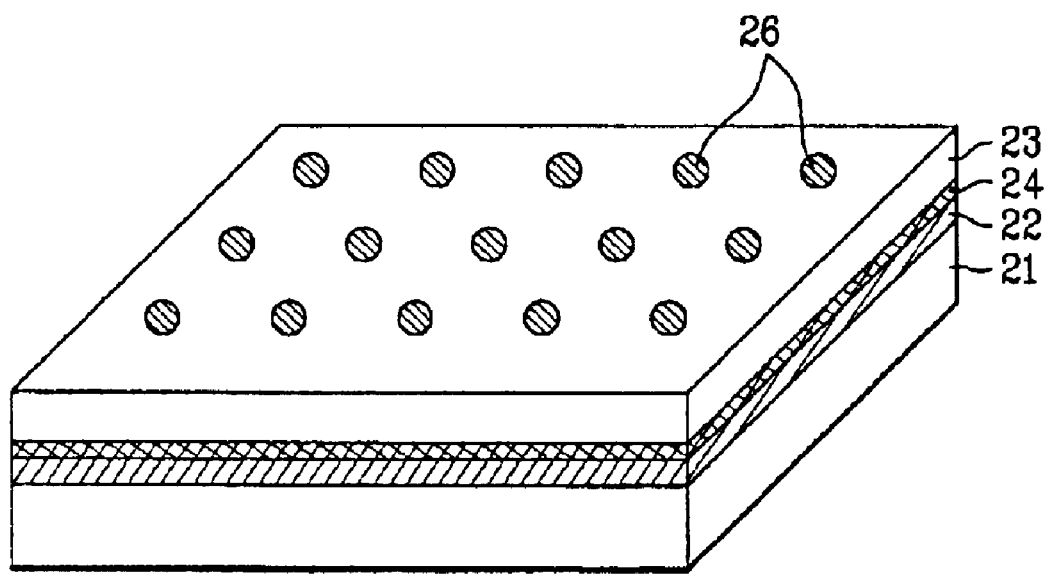

FIGS. 4A and 4B respectively illustrate a sectional and a perspective view for explaining a method for crystallizing an amorphous silicon film in accordance with a second embodiment of the present invention.

Referring to FIGS. 4A–4B, a silicon oxide ($SiO_2$) film 22 is formed on a substrate 21 as a buffer layer.

Then, a very thin and uniform film of a first catalytic metal 24 of nickel or cobalt is disposed on an entire surface including the silicon oxide film 22, and amorphous silicon is deposited by CVD on an entire surface including the first catalytic metal 24, to form an amorphous silicon thin film 23.

Second catalytic metal 26 of nickel or cobalt is deposited on the amorphous silicon thin film 23 in a form of a plurality of independent patterns. For forming the second catalytic metal 26 in a form of independent island patterns, a mask or an etching process may be employed.

The first and the second catalytic metals 24 and 26 may be deposited by using plasma of a non-reactive gas, an ion beam, or a metal solution.

An area the first catalytic metal 24 is disposed to about $5 \times 10^{12}$–$5 \times 10^{14}$/cm², and the second catalytic metal is made to be below about ½ of the area of the first catalytic metal 24, at about $10^{14}$–$10^{16}$/cm². In order to increase the size of the crystalline grain, and to prevent occurrence of the leakage current caused by the catalytic metal, the amount of the catalytic metal is controlled.

Then, the amorphous silicon thin film is crystallized into polycrystalline silicon by a low temperature crystallization employing the catalytic metal and the electric field.

In detail, an annealing is carried out, in which the amorphous silicon thin film 23 having an underlying first catalytic metal 24 and an overlying second catalytic metal 26 is heat treated, to elevate a temperature of the substrate, to form a silicide phase by diffusing the first and second catalytic metals 24 and 26 from an interface with the silicon thin film to the silicon thin film.

Next, electrodes 25 are provided on opposite ends of the amorphous silicon thin film 23, and an electric field with an intensity in a range of about 1–1000V/cm is applied thereto, for growing crystalline grains centered on the silicide.

The electrodes are formed of molybdenum (Mo), graphite, or the like, and the intensity of the electric field is varied with time.

Eventually, the amorphous silicon thin film 23 on the substrate 21 is crystallized with the second catalytic metal taken as main seeds, to form a polycrystalline silicon film.

The annealing and the application of the electric field may be carried out simultaneously.

Third Embodiment

Figure 5A:
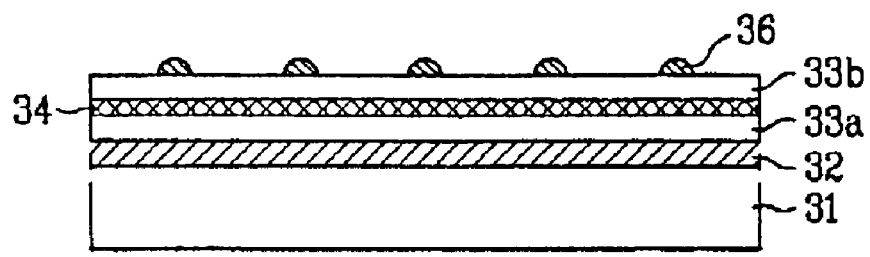
FIGS. 5A and 5B respectively illustrate a sectional and a perspective view for explaining a method for crystallizing an amorphous silicon film in accordance with a third embodiment of the present invention.
Figure 5B:
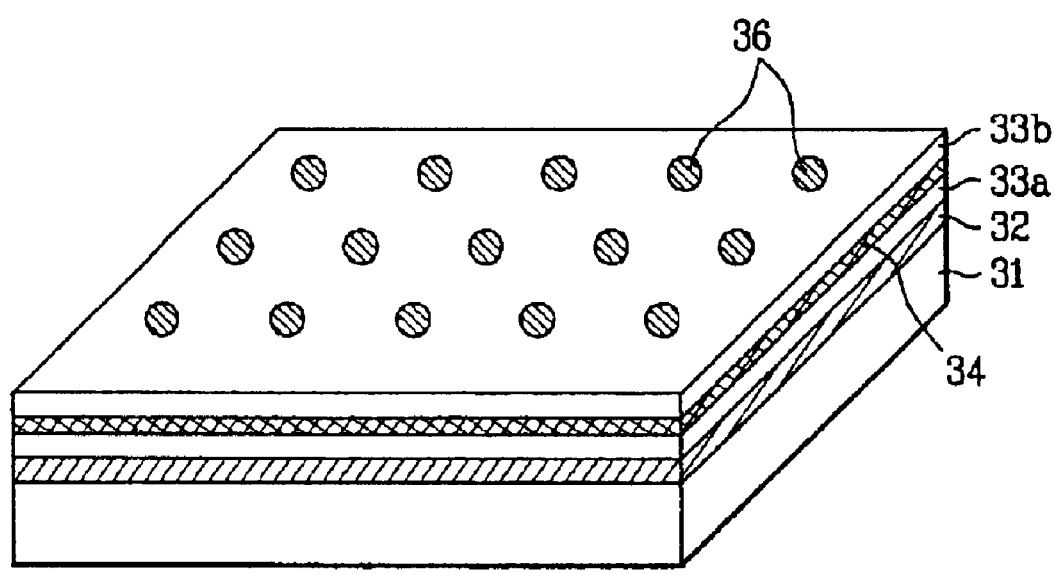

FIGS. 5A and 5B respectively illustrate a sectional and a perspective views for explaining a method for crystallizing an amorphous silicon film in accordance with a third embodiment of the present invention.

Referring to FIGS. 5A–5B, a silicon oxide ($SiO_2$) film 32 is formed on a substrate 31 as a buffer layer. The silicon oxide film 32 is obtained by bringing oxygen or water vapor into contact with the silicon thin film deposited on the substrate, to make a chemical reaction.

Then, amorphous silicon is deposited on the silicon oxide film 32 by plasma CVD, to form a first amorphous silicon thin film 33a, and a very thin and uniform film of first catalytic metal 34 of nickel or cobalt is disposed on an entire surface of the silicon oxide film 33a. After the first catalytic metal 34 is deposited, the amorphous film 33a is heat treated, to elevated the temperature.

Next, amorphous silicon is deposited by plasma CVD on an entire surface including the first catalytic metal 34, to form a second amorphous silicon thin film 33b, and second catalytic metal 36 of nickel or cobalt is deposited on the second amorphous silicon thin film 33b in a form of a plurality of independent patterns.

The first catalytic metal 34 is formed to about $5 \times 10^{12} – 5 \times 10^{14} / cm^2$, and the second catalytic metal 36 is made to be below about ½ of the area of the first catalytic metal 34, at about $10^{14} – 10^{16} / cm^2$. In order to increase a size of the crystalline grain, and to prevent occurrence of a leakage current caused by the catalytic metal, it is important to control the amount of the catalytic metal.

Then, heat is applied to the first, and second amorphous silicon thin films 33a and 33b from above the second amorphous silicon thin film 33b, to elevate the temperatures of the first, and second amorphous silicon thin films 33a and 33b, when the first, and second catalytic metals are diffused into the silicon thin films, to form a silicide phase.

Next, electrodes (not shown) are provided on opposite ends of the second amorphous silicon thin film 33b, and an electric field with an intensity in a range of about 1–1000V/cm is applied thereto, for growing crystalline grains centered on the silicide. In this instance, the crystalline grains grow using the second catalytic metal as main seeds.

Eventually, the first, and second amorphous silicon thin films 33a and 33b on the substrate 31 are crystallized, to form a polycrystalline silicon thin film.

Fourth Embodiment

Figure 6A:
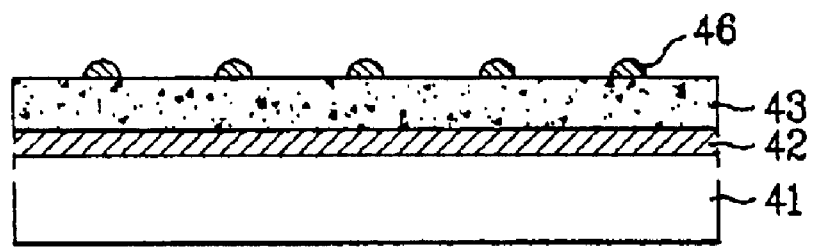
FIGS. 6A and 6B respectively illustrate a sectional and a perspective view for explaining a method for crystallizing an amorphous silicon film in accordance with a fourth embodiment of the present invention.
Figure 6B:
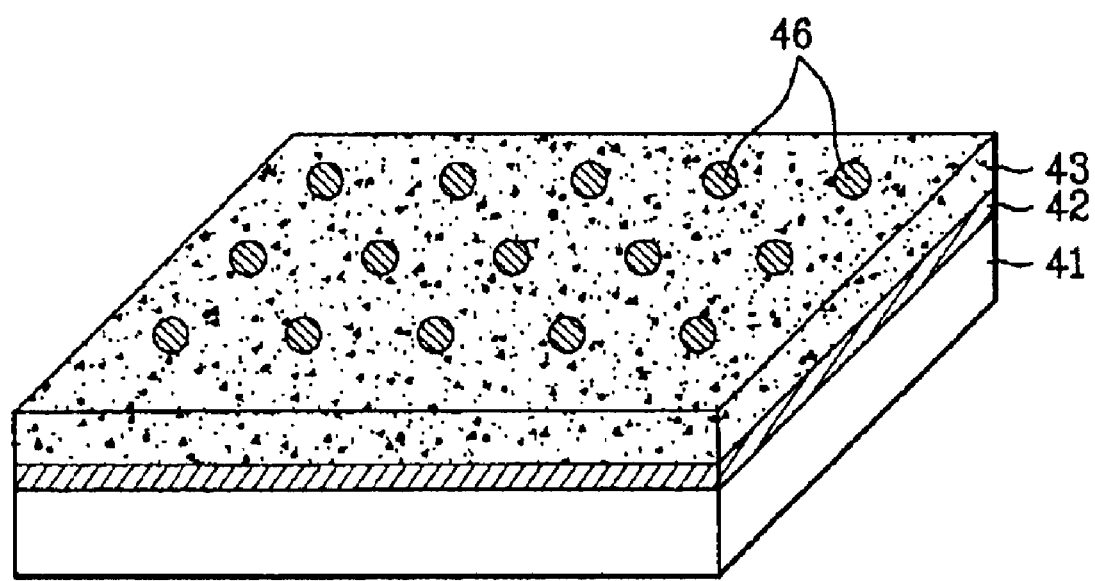

FIGS. 6A and 6B respectively illustrate a sectional and a perspective view for explaining a method for crystallizing an amorphous silicon film in accordance with a fourth embodiment of the present invention.

Referring to FIGS. 6A–6B, a silicon oxide ($SiO_2$) film 42 is formed on a substrate 41 as a buffer layer.

Then, amorphous silicon is deposited on the silicon oxide film 42 by plasma CVD, to form an amorphous silicon thin film 43. The amorphous silicon thin film 43 uniformly contains first catalytic metal, such as nickel or cobalt.

Then, after covering a mask having a plurality of independent patterns formed thereon on the amorphous silicon thin film 43 containing the first catalytic metal, a second catalytic metal 46 of nickel or cobalt is deposited on predetermined parts thereof.

The second catalytic metal 46 may be deposited by employing plasma of a non-reactive gas, an ion beam, or a metal solution, to have an incident amount of about $10^{14} – 10^{16}$ particles/$cm^2$. It is important that the amount of the catalytic metal is controlled for increasing a size of the crystalline grain, and preventing occurrence of a leakage current caused by remaining catalytic metal.

Next, after annealing the amorphous silicon thin film 43 containing the first catalytic metal, electrodes (not shown) are fitted to opposite ends of the amorphous silicon thin film 43, and an electric field with an intensity ranging about 1–1000V/cm is applied thereto, to crystallize the amorphous silicon thin film into polycrystalline silicon.

In the foregoing embodiment, the annealing and the application of the electric field may, or may not be carried out simultaneously, or the application of the electric field may be omitted depending on processing conditions.

Figure 7:
FIG. 7 illustrates optical microscopic photographs of a polycrystalline silicon thin film of the present invention.
Figure 7:
Figure 7:
Figure 7:
Figure 7:

FIG. 7 illustrates optical microscopic photographs of a polycrystalline silicon thin film of the present invention, for different intensities of the electric field.

The polycrystalline silicon thin film is obtained by depositing about 200 nm thick amorphous silicon, depositing nickel, the first catalytic metal, on the amorphous silicon thin film on an average of about $5 \times 10^{13}$ $cm^2$, depositing nickel, second catalytic metal, on a part of the amorphous silicon thin film on an average of about $5 \times 10^{14}$ $cm^{-2}$ using a mask, and subjecting to heat treatment at 500° C. for 30 minutes while varying the electric field. It can be noted that an optical transmittivity of the polycrystalline silicon is much higher than the amorphous silicon thin film.

That is, FIG. 7A illustrates an optical microscopic photograph of a polycrystalline silicon thin film crystallized in a state the electric field is not applied thereto, wherein it can be noted that the optical transmittivity is high in the part where nickel, the second catalytic metal, is deposited on a part of the amorphous silicon thin film. Since the optical transmittivity is proportional to the crystallinity, the crystallization starts from the part where the second catalytic metal is deposited.

FIG. 7B illustrates an optical microscopic photograph of a polycrystalline silicon thin film crystallized in a state the electric field with an intensity of about 40V/cm is applied thereto, wherein it can be noted that there is no significant difference of the optical transmittivity from the optical transmittivity of the silicon thin film taken in a state the electric field is not applied thereto.

FIG. 7C illustrates an optical microscopic photograph of a polycrystalline silicon thin film crystallized in a state the electric field with the intensity of about 60V/cm is applied thereto, wherein it can be noted that the crystallization starts in a part where nickel, the second catalytic metal, is deposited at first, and the crystallization also occurs in a part where nickel, the first catalytic metal is deposited.

FIG. 7D illustrates an optical microscopic photograph of a polycrystalline silicon thin film crystallized in a state the electric field with the intensity of about 80V/cm is applied thereto, wherein it can be noted that the part where nickel, the second catalytic metal, is deposited is crystallized, and the crystallized area is expanding as the crystallization is progressed in regions around the part where nickel is deposited. It can also be noted that the crystallization is progressing in a lateral direction from the first catalytic metal region like MILC in the area the second catalytic metal is deposited.

FIG. 7E illustrates an optical microscopic photograph of a polycrystalline silicon thin film crystallized in a state the electric field with an intensity of about 100V/cm is applied thereto, wherein it can be noted that the second catalytic metal region is crystallized at first, and in succession, and the crystallization is progressed for the whole region of the first catalytic metal, thereby crystallizing entire amorphous silicon, completely.

Figure 8:
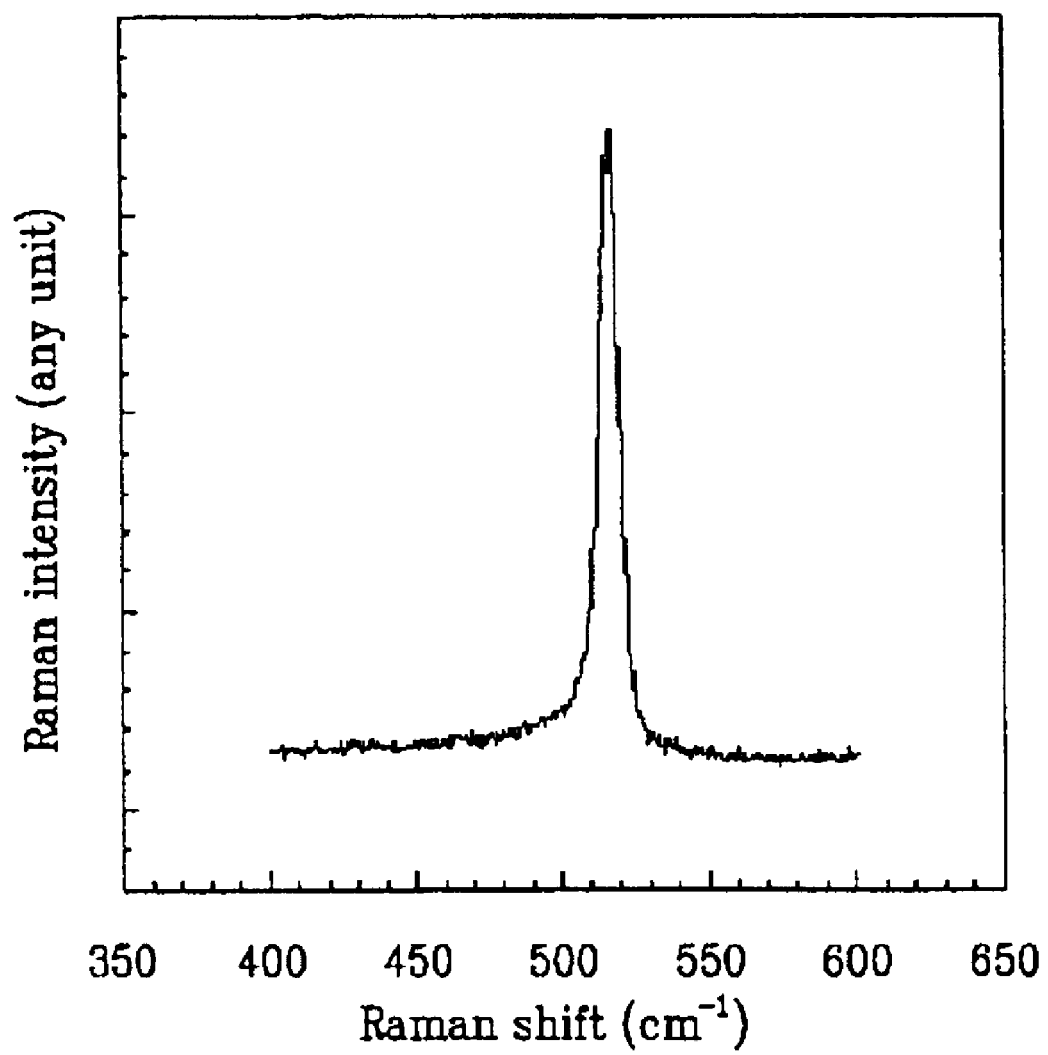
FIG. 8 illustrates a graph showing Raman spectra of a polycrystalline silicon thin film of the present invention; and, FIGS. 9A–9F illustrate the steps of a method for fabricating an LCD in accordance with an embodiment of the present invention.

In the meantime, FIG. 8 illustrates a graph showing Raman spectra of a polycrystalline silicon thin film of the present invention.

Referring to FIG. 8, it can be noted that Raman spectra of the polycrystalline silicon formed in accordance with an embodiment of the present invention has a sharp peak caused by the crystalline silicon in the vicinity of about 520 cm$^{-1}$, and a moderate wide peak in the vicinity of about 500$^{-1}$ caused by fine crystalline grains. It can also be noted that there is no peak caused by amorphous silicon in the vicinity of about 480 cm$^{-1}$ as an evidence that there is no amorphous silicon, implying that the amorphous silicon is crystallized, completely. An accurate calculation shows about an 87.01% of crystallization ratio (volume fraction).

A method for fabricating an LCD having the method for crystallizing an amorphous silicon film in accordance with a first embodiment of the present invention applied thereto will be explained.

FIGS. 9A–9F illustrate the steps of a method for fabricating an LCD in accordance with a preferred embodiment of the present invention.

Figure 9A:
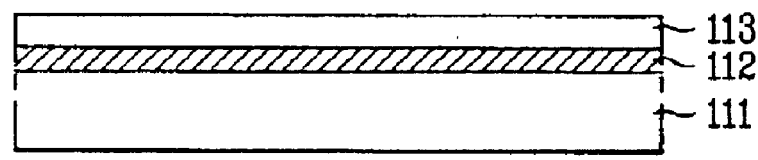

Referring to FIG. 9A, a silicon film is formed on a first substrate 111, and a chemical reaction occurs with oxygen or water vapor at an elevated temperature of 800–1200°, to form a silicon oxide film (SiO$_2$) 112, and amorphous silicon is deposited by plasma CVD, to form an amorphous silicon thin film 113.

Next, the amorphous silicon thin film is crystallized into polycrystalline silicon by a crystallizing method using catalytic metal and an electric field.

Figure 9B:
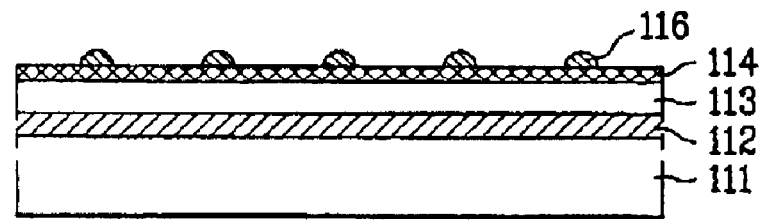

In detail, referring to FIG. 9B, a very thin film of first catalytic metal 114 of nickel or cobalt is deposited on the amorphous silicon thin film 113, and a second catalytic metal 116 of nickel or cobalt is deposited on the amorphous silicon thin film 113 having the first catalytic metal 114 deposited thereon in a form of a plurality of independent patterns.

The first, and second catalytic metal may be deposited by using plasma of a non-reactive gas, an ion beam, or a metal solution.

The catalytic metal 114 maybe deposited at about 5×10$^{12}$–5×10$^{14}$ particles/cm$^2$, the second catalytic metal 116 may be deposited to have an area about ½ of the area of the first catalytic metal at about 10$^{14}$–10$^{16}$ particles/cm$^2$, and the amount of the catalytic metal is controlled for increasing a size of the crystalline grain and preventing a leakage current caused by remained catalytic metal.

Figure 9C:
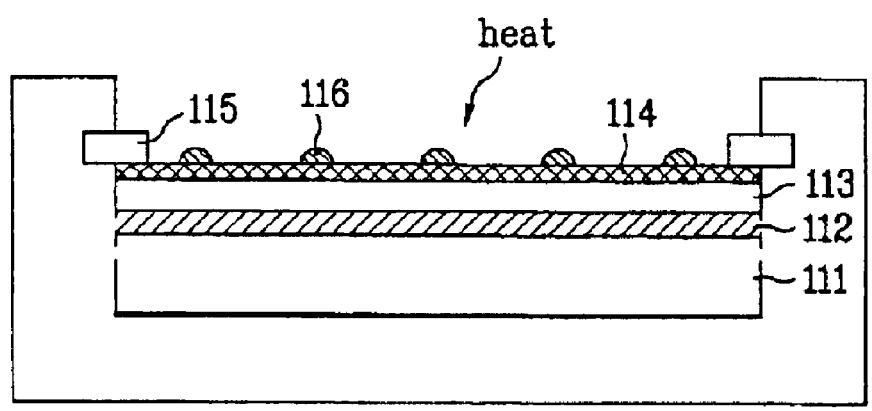

Referring to FIG. 9C, electrodes 115 are provided on opposite ends of the amorphous silicon thin film 113, and an electric field with a intensity ranging about 1–500V/cm is applied thereto to cause growth of crystalline grains centered on the silicide. The electrodes are formed of molybdenum (Mo), graphite, or the like, and the intensity of the electric field is varied with time.

In this instance, a first annealing may be carried out for the amorphous silicon thin film 113 after the first catalytic meal 114 is deposited, and a second annealing may be carried out for the amorphous silicon thin film 113 after the first catalytic meal 116 is deposited, and the first and second annealing may be carried out simultaneously with the electric field application.

Thus, the growth of crystalline grains is caused by the catalytic metal, the electric field, and the annealing, using the catalytic metal as seeds, to crystallize the amorphous silicon thin film into a polycrystalline silicon thin film.

Figure 9D:
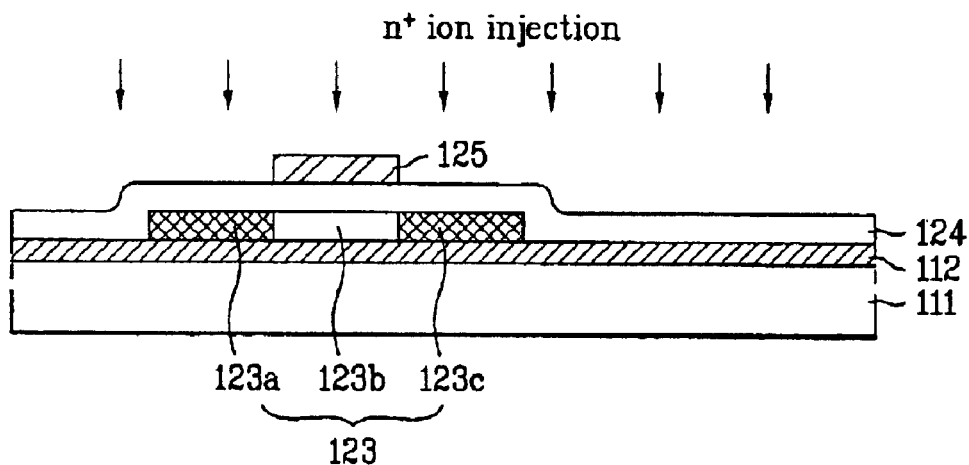

Referring to FIG. 9D, the polycrystalline silicon thin film is patterned, to form a semiconductor layer 123, and an insulating film of silicon nitride or the like are sputtered on an entire surface including the semiconductor layer 123, to form a gate insulating film 124 with a thickness of about 1800 Å.

A low resistance metal is deposited on the gate insulating film 124 to a thickness around 3000 Å, and patterned by photolithography to form a gateline and a gate electrode 125 branched from the gateline.

Then, n$^+$ impurities are ion injected into the semiconductor layer 123 with the gate electrode 125 used as a mask, and the injected ions are activated by laser radiation or high temperature heat treatment in a range of about 450° C., to form source/drain regions 123a/123c and a channel region 123b.

Figure 9E:
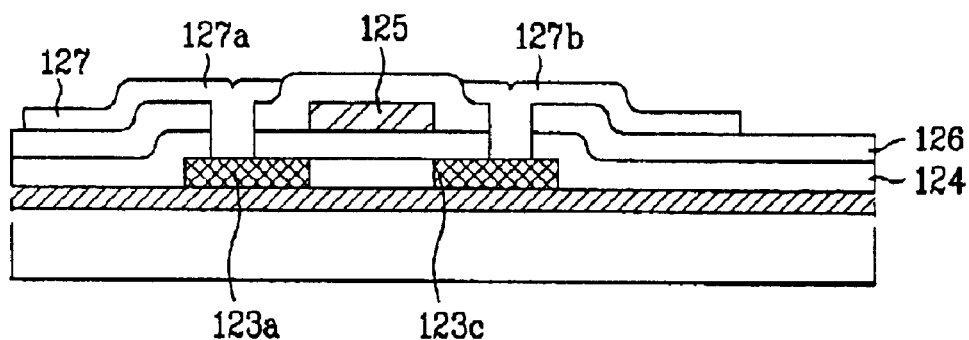

Referring to FIG. 9E, an insulating film of silicon nitride with a low dielectric constant is deposited on an entire surface including the gate electrode 125 by plasma CVD, to form an interlayer insulating film 126, and the interlayer insulating film 126 and the gate insulating film 124 are selectively removed, to expose a part of each of the source/drain regions 123a/123c.

Then, a low resistance metal is deposited on the interlayer insulating film 126, patterned by photolithography, to form a dataline 127 crossing the gateline and source/drain electrodes 127a/127b connected to the source/drain regions 123a/123c.

The semiconductor layer of the polycrystalline silicon, the gate electrode, the source/drain electrodes form a polycrystalline silicon thin film transistor arranged at a point where the gateline and the dataline cross.

Since the control of the amount of catalytic metal leaves almost no catalytic metal in the channel region of the polycrystalline silicon thin film transistor, a leakage current caused by remaining catalytic metal does not occur.

Figure 9F:
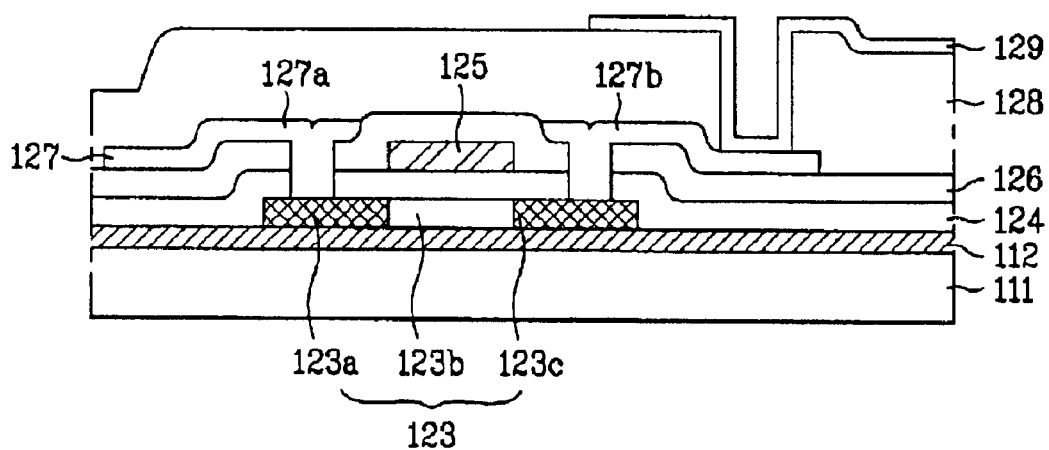

In succession, referring to FIG. 9F, a thickness of an insulating film such as benzocyclobutene (BCB), acrylic resin, silicon nitride, or the like, is formed on an entire surface including the source/drain electrodes 127a/127b, to form a protection film 128.

A transparent conductive film of indium tin oxide (ITO) or the like is deposited on the protection film 128, and patterned, to form a pixel electrode 129 connected to the drain electrode 127b.

Next, though not shown, a color filter layer of Red, Green, Blue (R, G, B) is formed on a second substrate by dyeing, electrodepositioning, pigment spraying, printing or the like, and a common electrode of ITO is formed on the color filter layer.

Finally, the first substrate and the second substrate are aligned and bonded. Liquid crystal is injected into a few micrometers of space between the substrates, and a liquid crystal injection hole is sealed, to complete fabrication of an LCD of the polycrystalline silicon.

The foregoing method for fabricating an LCD having the first embodiment of the method for crystallizing an amorphous silicon film applied thereto may include a variety of embodiments.

As has been explained, the method for crystallizing an amorphous film, and the method for fabricating an LCD by using the same have the following advantages.

The crystallization of an amorphous film, having the first catalytic metal deposited on an entire surface of the amorphous film to a very thin layer and the second catalytic metal deposited on predetermined parts in the form a plurality of independent patterns as seeds, reduces an amount of remaining metal, and enhances the crystallinity of the crystalline thin film. The bi-layered catalytic metal shortens the crystallization time period and decreases the crystallization temperature.

Accordingly, in place of the laser polycrystalline silicon film used presently, the polycrystalline silicon film of the present invention can be used as a polycrystalline silicon film for a thin film transistor LCD, solar cells, image sensors, and the like. Moreover, the advantage of the availability of low temperature fabrication may replace a polycrystalline silicon film formed by a high temperature solid state crystallization.

It will be apparent to those skilled in the art that various modifications and variations can be made in the method for crystallizing an amorphous film and the method for fabricating a liquid crystal display device (LCD) by using the same of the present invention without departing from the spirit or scope of the invention. Thus, it is intended that the present invention cover the modifications and variations of this invention provided they come within the scope of the appended claims and their equivalents.

What is claimed is:

1. A method for crystallizing an amorphous film, comprising:
    forming an amorphous film on a substrate;
    forming a first metal layer on the amorphous film;
    forming a second metal layer on the first metal layer at predetermined parts; and
    heat treating the amorphous film, for crystallizing the amorphous film.

2. A method of claim 1, wherein the first metal layer is a catalytic metal to crystallize the amorphous film.

3. A method of claim 1, wherein the second metal layer is a catalytic metal to crystallize the amorphous film.

4. A method of claim 1, wherein the first metal layer is formed in a middle layer of the amorphous film.

5. A method of claim 4, wherein forming the first metal layer in a middle layer of the amorphous film includes:
    forming a first amorphous film on the substrate,
    forming a first metal layer on the first amorphous film, and
    forming a second amorphous film on an entire surface including the first metal layer.

6. A method of claim 1, wherein the second metal layer is formed in a form of a plurality of independent islands.

7. A method of claim 1, further comprising heat treating the amorphous film after the first metal layer is formed.

8. A method of claim 1, further comprising applying an electric field simultaneously with the heat treating the amorphous film.

9. A method of claim 1, further comprising applying an electric field separate from the heat treating the amorphous film.

10. A method of claim 8, wherein the electric field is varied with time.

11. A method of claim 8, wherein the electric field has an intensity of about 0–500V/cm.

12. A method of claim 9, wherein the electric field has an intensity of about 0–500V/cm.

13. A method of claim 1, wherein the first metal layer is formed of nickel or cobalt.

14. A method of claim 1, wherein the first metal layer has a deposition amount of about $5\times10^{12}$–$5\times10^{14}$ particles/cm$^2$.

15. A method of claim 1, wherein the second metal layer is formed of nickel or cobalt.

16. A method of claim 1, wherein the second metal layer has a deposition amount of about $10^{14}$–$10^{16}$ particles/cm$^2$.

17. A method of claim 1, wherein the second metal layer has an area below about ½ of the area of the first metal layer.

18. A method of claim 1, wherein the amorphous film is formed of amorphous silicon.

19. A method of claim 1, wherein the first or second metal layer is formed by one of an ion beam, plasma, and a metal solution.

20. A method of claim 1, further comprising forming a buffer layer on the substrate before forming the amorphous film.

21. A method for fabricating a liquid crystal display device, comprising:
    forming an amorphous film on a first substrate;
    forming a first metal layer on the amorphous film;
    forming a second metal layer on the first metal layer at predetermined parts;
    heat treating the amorphous film, for crystallizing the amorphous film to form a polycrystalline film;
    patterning the polycrystalline film to form a semiconductor layer;
    forming a gate electrode in a part of the semiconductor layer insulated from the semiconductor layer;
    forming a channel region and source/drain regions by injecting impurities into the semiconductor layer;
    forming source/drain electrodes connected to the source/drain regions, respectively forming a pixel electrode connected to the drain electrode; and
    forming a liquid crystal layer between the first substrate and a second substrate opposite to the first substrate.

22. A method of claim 21, wherein the first metal layer is formed on one of a top of, under, and in the middle layer of the amorphous film.

23. A method of claim 21, wherein the second metal layer is formed in a form of a plurality of independent islands.

24. A method of claim 21, further comprising heat treating the amorphous film after the first metal layer is formed.

25. A method of claim 21, further comprising applying an electric field simultaneously with the heat treating the amorphous film.

26. A method of claim 21, further comprising applying an electric field separate from the heat treating the amorphous film.

27. A method of claim 25, wherein the electric field is varied with time.

28. A method of claim 25, wherein the electric field has an intensity of about 0–500V/cm.

29. A method of claim 21, wherein the first metal layer is formed of nickel or cobalt.

30. A method of claim 21, wherein the first metal layer has a deposition amount of about $5\times10^{12}$–$5\times10^{14}$ particles/cm$^2$.

31. A method of claim 21, wherein the second metal layer has a deposition amount of about $10^{14}$–$10^{16}$ particles/cm$^2$.

32. A method of claim 21, wherein the second metal layer has an area below about ½ of the area of the first metal layer.

33. A method of claim 21, wherein the amorphous film is formed of amorphous silicon.

34. A method of claim 21, wherein the first or second metal layer is formed by using one of an ion beam, plasma, and a metal solution.

35. A method of claim 21, further comprising forming a buffer layer on the substrate before forming the amorphous film.

36. A method of claim 21, further comprising:
    forming a gateline simultaneously with the gate electrode; and
    forming dataline crossing the gateline simultaneously with the source/drain electrodes.

37. A method of claim 21, further comprising forming an insulating film on an entire surface including the gate electrode after the gate electrode is formed.

38. A method of claim 37, wherein the insulating film is formed of silicon nitride or silicon oxide.

39. A method of claim 21, further comprising forming a protection film that exposes a part of the drain electrode after the source/drain electrodes are formed.

40. A method of claim 39, wherein the protection film is formed of one of BCB, acrylic resin, silicon nitride, and silicon oxide.

41. A method for crystallizing an amorphous film, comprising:

forming a first catalytic metal layer on a substrate;

forming an amorphous film on the first catalytic metal layer;

forming a second catalytic metal layer on the amorphous film at predetermined parts; and heat treating the amorphous film, for crystallizing the amorphous film, wherein the first and second catalytic metal layers are to crystallize the amorphous film.

42. A method for crystallizing an amorphous film, comprising:

forming a first amorphous film on a substrate;

forming a first metal layer on the first amorphous film;

forming a second amorphous film on the first metal layer;

forming a second metal layer on the second amorphous film at predetermined parts; and heat treating the first and second amorphous films, for crystallizing the first and second amorphous films.

43. A method for crystallizing an amorphous film, comprising:

forming an amorphous film containing a first catalytic metal;

forming a second catalytic metal layer on the amorphous film at predetermined parts; and heat treating the amorphous film, for crystallizing the amorphous film, wherein the first and second catalytic metal layers are to crystallize the amorphous film.

44. A method of claim 41, wherein the first catalytic metal layer has a deposition amount of about $5 \times 10^{12}$–$5 \times 10^{14}$ particles/cm$^2$.

45. A method of claim 41, wherein the second catalytic metal layer has a deposition amount of about $5 \times 10^{12}$–$5 \times 10^{16}$ particles/cm$^2$.

46. A method of claim 43, wherein the first catalytic metal layer has a deposition amount of about $5 \times 10^{12}$–$5 \times 10^{14}$ particles/cm$^2$.

47. A method of claim 43, wherein the second catalytic metal layer has a deposition amount of about $5 \times 10^{14}$–$5 \times 10^{16}$ particles/cm$^2$.

* * * * *